United States Patent [19]

Meisner et al.

[11] 4,180,087
[45] Dec. 25, 1979

[54] AUTOMATIC CONTROL FOR AN ADJUSTABLE MEMBER

[75] Inventors: Alfred Meisner; Erich Gerum, both of Nuremberg, Fed. Rep. of Germany

[73] Assignee: Firma DIEHL, Nuremberg, Fed. Rep. of Germany

[21] Appl. No.: 817,740

[22] Filed: Jul. 21, 1977

[30] Foreign Application Priority Data

Jul. 22, 1976 [DE] Fed. Rep. of Germany ....... 2632994

[51] Int. Cl.² ..................... A01G 25/16; H01J 39/12
[52] U.S. Cl. .............................. 137/78; 137/624.11; 239/63; 250/214 AL
[58] Field of Search ............... 137/78, 624.13, 624.11; 239/63, 64; 250/206, 214 AL

[56] References Cited

U.S. PATENT DOCUMENTS

| | | | |
|---|---|---|---|
| 2,946,512 | 7/1960 | Richards | 239/63 |
| 3,500,844 | 3/1970 | Sanner | 137/78 |
| 3,590,335 | 6/1971 | Tetar | 239/64 X |
| 3,665,224 | 5/1972 | Kelsey | 250/214 AL X |
| 3,777,976 | 12/1973 | Milovancevic | 137/78 |
| 4,114,647 | 9/1978 | Sturman et al. | 239/63 X |

FOREIGN PATENT DOCUMENTS 822566 10/1959 United Kingdom ................. 137/78 X Primary Examiner—Martin P. Schwadron
Assistant Examiner—Richard Gerard
Attorney, Agent, or Firm—Burns, Doane, Swecker & Mathis

[57] ABSTRACT

A switching arrangement for the control of an adjustable member such as a valve includes a light sensitive switch. Detection of a particular light value enables a frequency divider to transmit an opening pulse to a valve control circuit a predetermined delay period after the detection of such light value. The frequency of an output signal of a pulse generator is varied in response to the opening pulse and the frequency divider transmits a closing pulse to the control circuit after a second predetermined time period of different duration from the delay period. In one disclosed embodiment, control of the frequency divider is responsive to moisture content of soil as well as ambient light level for application in automatic sprinkler systems.

13 Claims, 5 Drawing Figures

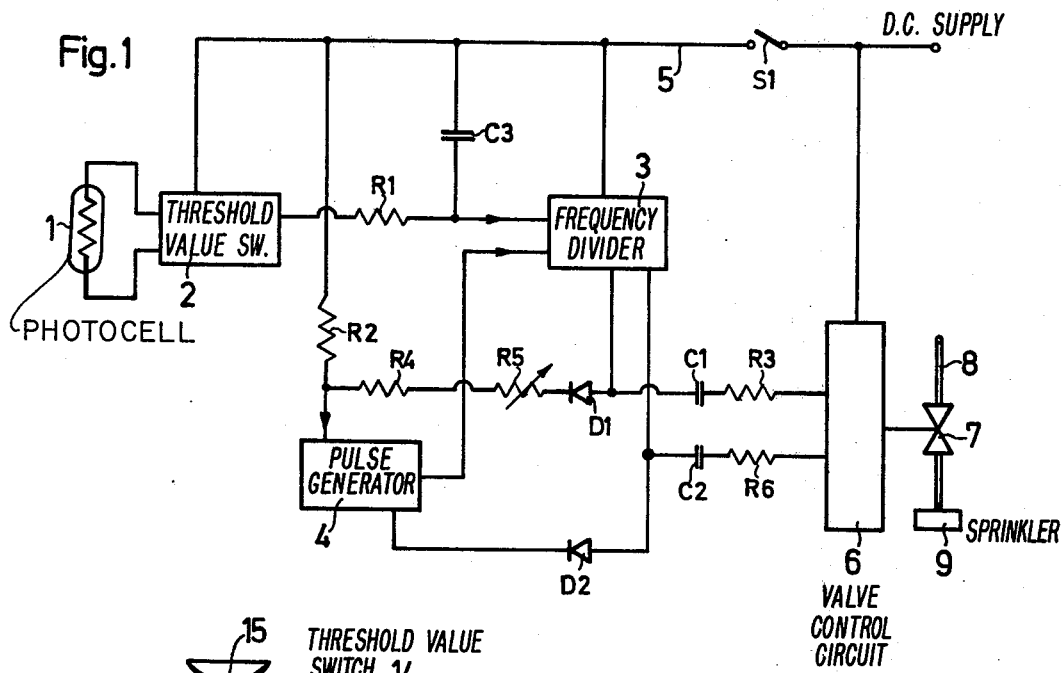
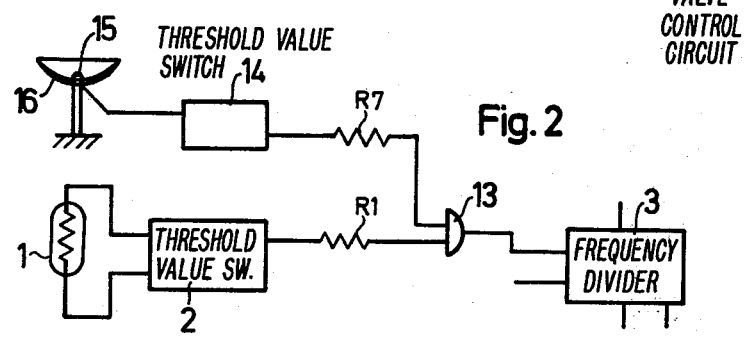
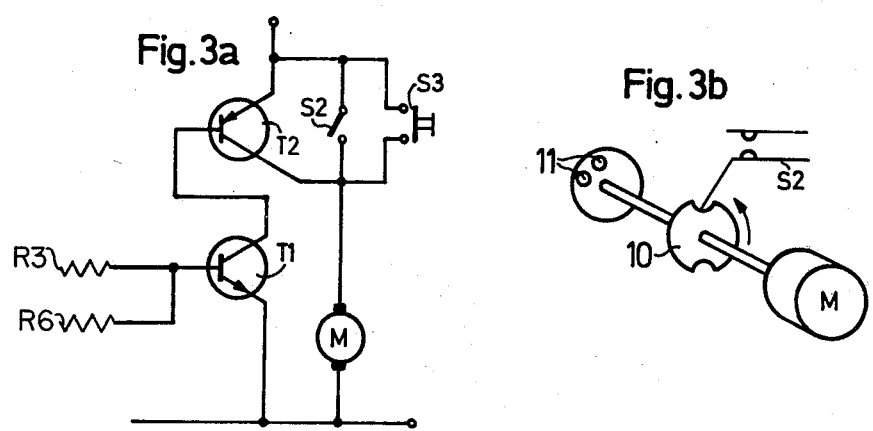

AUTOMATIC CONTROL FOR AN ADJUSTABLE MEMBER

BACKGROUND OF THE INVENTION

The invention relates to a switching arrangement for the control of an adjustable member, such as a valve, whereby the adjustable member is turned off or closed automatically after an adjustable time period during which the adjustable member was on or opened. The invention particularly relates to the control of a valve which forms part of an automatic sprinkling system.

Experience has shown that watering of a garden or lawn is most successful whenever the sprinkling is carried out at the onset of twilight. Consequently very many gardens are sprinkled at this time, so that the pressure in the water mains fluctuates with a relatively high degree of variation from the normally encountered pressure. If automatic sprinkling is carried out at this time, the success of watering, which is difficult to estimate in advance, would tend to be irregular.

In prior art automatic sprinkling systems a water control clock mechanism is used to control the sprinklers. The clock mechanism closes an adjustable valve in series connection with a water sprinkler after the course of a manually initiated valve open period set on the clock mechanism. Automatic opening of the valve is not possible with this arrangement, so that it cannot be used whenever a water sprinkler is to be turned on and off daily, for several days.

Furthermore, this type of prior art control for water sprinkling systems operates with a precision clock mechanism, which is sealed against the water carrying parts of the arrangement. This sealing requires a considerable construction expenditure.

An electric time switching clock is available on the market by means of which an electric circuit may be turned on and off daily at certain times during a 24 hour period. The times of turning on and off may be adjusted successively. However, the use of such an electric switching clock to overcome the difficulties mentioned above with respect to twilight watering is prohibitive, as it would represent an unnecessary expense due to the cost of the clock mechanism and moreover may be adjusted for a time dependent upon twilight only after special considerations, calculations, and adjusting efforts.

OBJECTS AND BRIEF SUMMARY OF THE INVENTION

It is accordingly an object of the present invention to provide a novel sprinkler control mechanism and method that overcomes the foregoing problems associated with prior art mechanisms.

It is another object of the present invention to provide a novel method and switching arrangement for light level dependent control of an adjustable member.

It is a further object of the invention to provide a novel method and switching arrangement, independent of a clock mechanism, by means of which the duration of sprinkling carried out by an automatic sprinkling system is placed into a favorable sprinkling time and outside the times of extreme fluctuations of water pressure.

According to the invention, these and other objects are achieved by providing a light sensitive input device for control of a switching arrangement, which device delivers an enabling signal at dusk, or other desirable period of the day, to a delay circuit, and actuates an adjustable member via a control circuit after the course of a time delay set by the delay circuit. A switching circuit is actuated concurrent with actuation of the adjustable member to determine the duration of the actuation period of the adjustable member. At the end of the actuation period, the adjustable member is deactuated via a deactuation signal sent to the control circuit.

In the disclosed embodiment, the switching arrangement is utilized for the control of a valve in an automatic sprinkling system. The sprinkling is designed to take place whenever a delay period has passed after dusk or other suitable time of the day determined by ambient light levels. This delay period is adjusted such that it is to be assumed that no further undesirable fluctuations take place in the water mains. The actuation of the valve takes place according to the course of the sun, so that a clock mechanism is unnecessary. The adaptation of the actuation time comes about automatically to the period of dusk or similar such period occurring at different times in spring and fall than in summer, eliminating the need for adjustments or precise calculations.

The delay period is designed in the disclosed embodiment to be shorter than the period between dusk and dawn and longer than the maximum actuation time of the adjustable member. For example, the delay period will be one hour and the actuation period of the valve will be variable, between three and thirty minutes.

In the preferred embodiment, a particularly simple construction of a switching arrangement is achieved by providing a delay circuit made up of a digitally operating frequency divider with a pulse generator connected thereto. The frequency of the output signal of the pulse generator is changed in response to an actuation pulse from the frequency divider for determination of the length of the actuation period of the valve. In order to achieve an actuation time period which is relatively short as compared to the delay period, the frequency of the output signal of the pulse generator is increased during the actuation time. A switch for performing this function is of relatively simple construction as otherwise customary logic gate connections for connecting the frequency divider output terminals are omitted.

In order to prevent the sprinkler from turning on if the moisture in the soil is sufficient, a moisture sensitive device is provided as a further feature of the invention. The moisture sensor of the moisture sensitive device lies in the effective area covered by the sprinkler. The moisture sensitive device provides an input step or pulse that acts as inhibit signal if the degree of moisture in the effective area covered by the sprinkler is sufficient, thereby preventing the actuation of the valve. The measurement of the actual moisture of the soil that is to be watered, for example by a soil probe, is not always favorable, since the result of the measurement in this case also depends on the nature of the pertinent soil. Therefore, the moisture sensor that provides the additional input step is preferably an evaporating cup disposed near or at ground level in the effective area of the sprinkler. In this case, sprinkling water is collected during the actuation period of the sprinkling system in the evaporation cup and is evaporated during the time prior to the next sprinkling process, corresponding to the drying out of the soil. One will appreciate that this feature allows the switching arrangement to be designed for the average requirements of an automatic sprinkling system, without the nature of the soil being of any significant importance.

These and other objects and advantages of the invention will become clear from the following description when read in conjunction with the drawings.

BRIEF DESCRIPTION OF THE DRAWINGS

FIG. 1 is a schematic block diagram of a switching arrangement with a light sensitive input step for automatically turning on and off of a sprinkler;

FIG. 2 is a section of the diagram of the switching arrangement of FIG. 1 with an additional moisture-sensitive input step;

FIGS. 3a and 3b are an illustration of a valve control circuit and associated mechanical structure for the switching arrangement of FIG. 1.

DETAILED DESCRIPTION OF THE DRAWINGS

Figure 4:
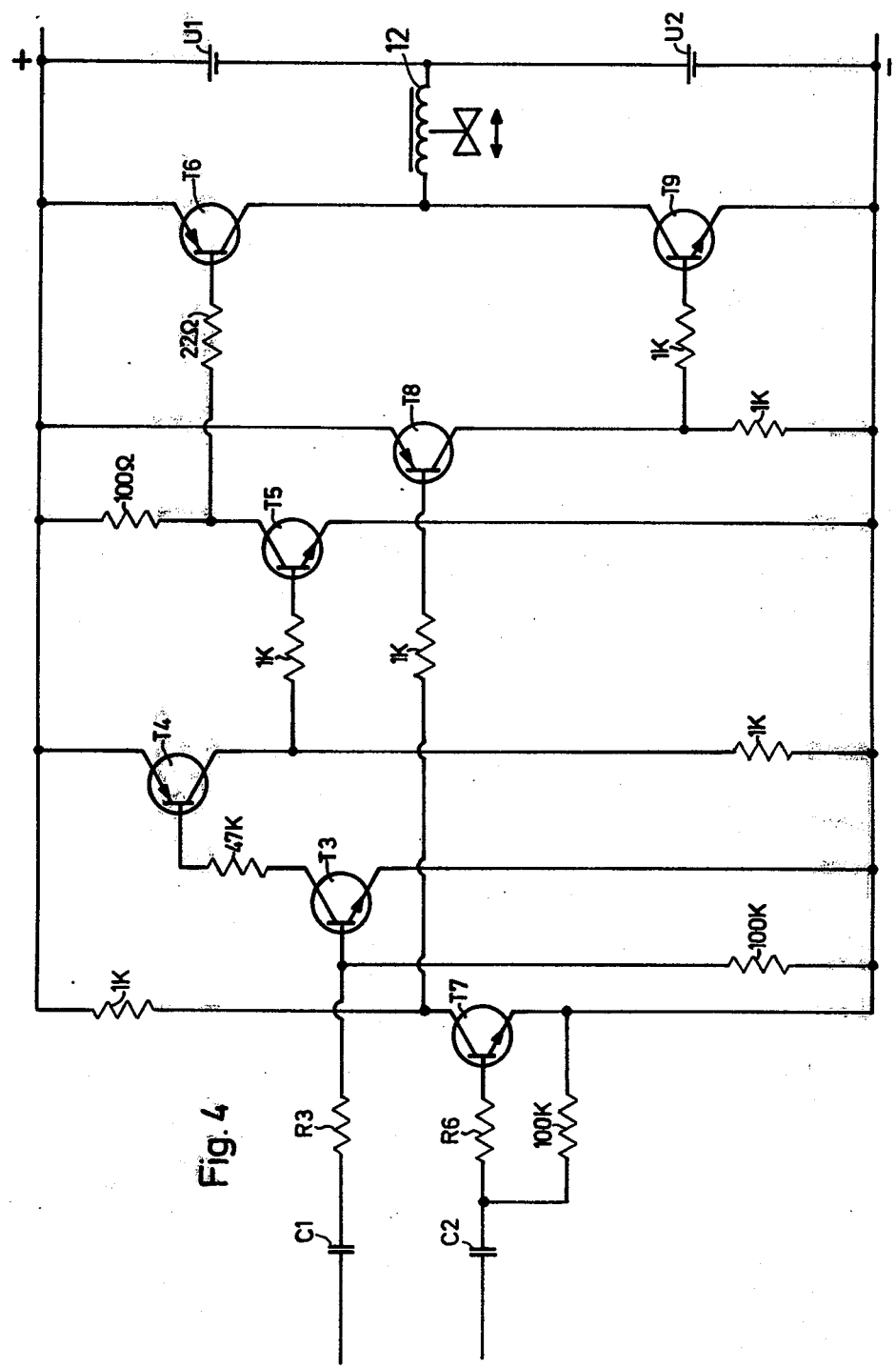
FIG. 4 is an alternative embodiment of the valve control circuit.

In FIG. 1, a photo conductive cell 1 is connected to a threshold value switch 2, which together form a light sensitive switch means. The threshold value switch can be, for example, a Schmitt-trigger. The output terminal of the threshold value switch 2 is connected by a biasing impedance R1 to the reset input terminal of a frequency divider 3. Such a frequency divider operates digitally and can be an integrated circuit, one type of which is obtainable on the market under the designation CD 4024 from RCA or others. A variable frequency pulse generator 4 is connected to the pulse input terminal of frequency divider 3. The pulse generator 4 has connected at an input terminal a resistor R2, the value of which determines the frequency of the pulse generator's output signal. The threshold value switch 2, the frequency divider 3 and the pulse generator are all connected to a common voltage supply line 5. The supply line 5 is connected with a D.C. current source via a switch S1.

The frequency divider 3 functions as a delay circuit in which the pulse sequence frequency of the output signal of pulse generator 4 is reduced. At an $n^{th}$ output terminal of the frequency divider 3, the pulse sequence frequency is smaller by a factor $2^n$ than the frequency of the output signal of pulse generator 4. At the $13^{th}$ output terminal of the divider 3, a positive impulse slope will occur only after 1 hour in the case of a pulse sequence frequency of 1.14 Hz in the output signal of the pulse generator 4. To the $13^{th}$ output terminal of the frequency divider 3 is connected a differentiating circuit consisting of capacitor C1 and resistor R3. The latter is connected to one input terminal of control circuit 6, described in more detail hereinafter, by means of which a valve 7 is opened or closed. The valve 7 is serially connected with a water pipe 8 to which a sprinkler 9 is attached.

A switching circuit, which is composed of the series connection of a resistor R4, a variable resistor R5 and a diode D1, is connected to the $13^{th}$ output terminal of the divider 3. This switching circuit is connected to the input terminal of the pulse generator 4.

An additional differentiating circuit C2, R6 is connected between the $14^{th}$ output terminal of the frequency divider 3 and an input terminal of the control circuit 6. The $14^{th}$ output terminal of the frequency divider 3 is connected to an inhibit input terminal of the pulse generator 4 by way of a diode D2.

When the switch S1 is closed, the switching arrangement is ready to operate. The frequency divider 3 is set to zero via a pulse produced by capacitor C3 during closing of the switch S1. The pulse generator 4 begins to operate, with the frequency of its output signal determined by the value of resistance R2. In the present example, the frequency is set at 1.4 Hz. The frequency of the pulse signal produced by signal generator 4 is reduced in the frequency divider when the resistance value of the photo conductive cell 1 rises beyond a predetermined threshold value, such as that present at dusk, and the threshold value switch 2 delivers an enabling signal to the reset terminal of the frequency divider 3 to establish the start of a delay period. The frequency of pulses produced by the pulse generator at this time is reduced in the frequency divider 3. After a predetermined delay of one hour an actuating pulse occurs at the $13^{th}$ output terminal of the frequency divider 3, which is differentiated by way of the differentiating circuit C1, R3 and which opens the valve 7 by way of the control circuit 6. At the same time the frequency of the output signal of the pulse generator 4 is increased by way of the switching circuit R4, R5 and D1, since the input signal to the pulse generator now contains an additional bias current via the switching circuit. The total input current establishes the duration of the actuation period. The resistance R5 is designed such that, in this disclosed example, the frequency of the output signal of the pulse generator 4 may be adjusted to be between 23 and 230 Hz.

As a result of the increase in frequency a deactuating signal occurs correspondingly sooner at the $14^{th}$ output terminal of the frequency divider 3. In the disclosed example, the output pulse at the $14^{th}$ output terminal occurs 3 to 30 minutes after the beginning of the pulse at the $13^{th}$ output terminal, depending on the setting of the resistor R5. The signal at the $14^{th}$ output terminal is processed by way of the differentiating member C2, R6 and the control circuit 6 to close the valve. At the same time this signal is applied to the inhibit terminal of the pulse generator by way of diode D2, as a result of which the pulse generator stops producing output pulses. The sprinkling for that night is thus finished. After the following dawn, the frequency divider 3 is disabled by way of the threshold value switch 2 due to the decrease in resistance of the photoconductive cell 1. On the next evening, the threshold value switch 2 sends another enabling signal to the frequency divider 3 to reset its contents to zero, thereby removing the inhibit signal to the pulse generator 4. The steps of producing the opening and closing pulses are repeated. When no automatic sprinkling is further desired the switch S1 is opened.

The operation of the frequency divider, pulse generator and switching circuit per se is explained in more detail in commonly assigned copending application Ser. No. 821,248 filed on Aug. 2, 1977 and entitled "Programmable Timing Circuit".

FIG. 2 illustrates a different embodiment of the switching arrangement which includes a moisture sensitive device as well as a light detector. The output terminal of an AND-gate 13 is connected to the reset terminal of the frequency divider 3. One of the input terminals of AND-gate 13 is connected with the output terminal of threshold value switch 2 and the other input terminal is connected via a biasing impedance 7 and an additional threshold value switch 14 to a moisture sensor 15. The moisture sensor 15 is disposed in an evaporating cup 16 at or near ground level. The remaining circuit resembles that in FIG. 1.

The evaporating cup 16 can be set up in the area swept by water from the sprinkler 9, although this is no absolute requirement. It collects sprinkling water during the operative period of the sprinkler 9. The length of the operative period of the sprinkler is not influenced by the evaporating cup assembly, however. After completion of the operative period, especially on the following day, the water evaporates from the evaporation cup 16, corresponding to the prevailing weather. If the water has not yet evaporated from the evaporating cup 16 shortly before the start of the next operative period, the moisture sensor 15 will indicate "moist" and send a signal to inhibit the AND-gate, so that the enabling signal delivered by the photoconductive cell 1 through the threshold value switch 2 may not activate the frequency divider 3. The frequency divider 3 thus does not start even after the onset of dusk whenever there still is any moisture in the evaporating cup 16. This provides a measure of the actual moisture of the soil that is to be sprinkled.

Whenever the moisture sensor 15 is dry at the onset of dusk, the valve 7 is turned on in the manner described above.

Obviously any possible rainfall will also influence the degree of moisture in the evaporating cup 16. This may thus lead to a postponement of actuating the valve 7.

If necessary, a sand or foam plastic filling may be provided in the evaporating cup 16. A switch sensitive to the weight of the filling which includes a contact having a plastic coated metal strip is suitable as a moisture sensor, whereby the plastic impedes any change in volume of the metal strip dependent on moisture which may lead to bending of the strip. A temperature sensitive resistance may alternatively be provided as a moisture sensor, which resistor is cooled by moisture in the evaporation cup 16.

In FIGS. 3a and 3b an embodiment for control circuit 6 is shown. The output signals of differentiating circuits C1, R3 and C2, R6 are applied to the base of a transistor T1. The base of a second transistor T2 is connected with the collector of transistor T1. When an output pulse occurs at one or the other of the differentiating circuits, a servo motor M, connected to the collector of transistor T2, will start to operate. As a result of this, an automatic holding switch S2 is closed by means of a cam disk 10 on the motor shaft, as shown in FIG. 3b. This switch is connected in parallel to the emitter-collector path of the transistor T2. After a revolution of the motor of 180° the automatic holding switch S2 opens and the motor stops until the next impulse. Magnets 11 are disposed on the motor shaft whose position control the operation of the valve 7 located adjacent thereto. The valve 7 is magnetically actuated and alternately opened and closed at every occurring impulse by rotation of the magnets through 180° to occupy different actuating positions relative to the valve 7. In order to initially set and adjust the correct switching position of cam 10, a key switch S3 is provided in parallel with the automatic holding switch S2.

FIG. 4 shows an alternate embodiment of a control circuit 6. In this example, a polarized electromagnet having a permanent magnet (not shown) for the core and a coil 12 is provided for the control of the valve 7. When a pulse occurs on the differentiating member C1, R3, the coil 12 is connected across voltage source U1 via transistors T3, T4, T5 and T6 to open the valve 7 by shifting the position of the core. A current of inverse direction of flow from the voltage source U2 flows through the coil whenever an impulse occurs on the differentiating member C2, R6 and is transmitted by way of transistors T7, T8 and T9 to return the core to its original position and close the valve. The resistance values shown in FIG. 4 are one example of bias values for the transistors which operate to perform the desired function of transmitting the pulse to the coil.

The switching arrangement described and the valve are accommodated in a housing which may be incorporated with the sprinkler 9. The adjustment of the desired sprinkling time is accomplished by means of an adjustable contact of the variable resistor R5 that may be accessible from the exterior of the housing. The photoconductive cell 1 is disposed on the housing such that it will respond to ambient brightness. In case of need it may be screened such that it will not respond to any artificial light.

Numerous other embodiments within the scope of the invention will be apparent to one of ordinary skill in the art. For example, the moisture sensor may also act on the switching arrangement in such a way that it turns the valve 7 off prior to termination of the adjusted actuated time in case there is sufficient moisture. Alternatively, the switching arrangement may be used for the control of lights in a house which is to be left unoccupied for a period of time. The invention is defined not by the foregoing description, which is merely for the purpose of illustration, but, rather, by the following claims in which the equivalents and obvious variations of all claimed features are intended to be embraced therein.

What is claimed is:

1. A switching arrangement for control of an adjustable member comprising:
    a light sensitive switching means for generating an enabling signal in response to a sensed light value beyond a predetermined threshold level;
    delay circuit means for receiving the enabling signal from the light sensitive switching means and providing an actuating signal a predetermined delay period after receipt of the enabling signal;
    a control circuit for control of the adjustable member, said control circuit receiving said actuating signal from the delay circuit means to actuate the adjustable member; and
    a switching circuit, responsive to the actuating signal, for establishing an input signal to the delay circuit means which causes the delay circuit means to transmit a deactuating signal to the control circuit a predetermined actuation period after receipt of the actuating signal by the control circuit.

2. A switching arrangement as defined in claim 1, wherein the adjustable member is a valve connected in a sprinkling system and wherein the predetermined delay period is such that it is shorter than the time period between dusk and dawn and longer than a maximum actuation period of the valve.

3. A switching arrangement as defined in claim 1, wherein the delay circuit means includes a digitally operating frequency divider and a variable frequency pulse generator wherein the frequency of the output signal of the pulse generator is changed by the switching circuit for determination of the actuation period.

4. A switching arrangement as defined in claim 3, wherein an output signal of an $n^{th}$ output terminal of the frequency divider actuates the adjustable member and an output signal of the n+1 output terminal of the frequency divider deactuates the adjustable member, and further wherein the output signal of the $n^{th}$ output terminal is applied to the pulse generator via a resistance, increasing the frequency of the output signal of the pulse generator and an output signal of the n+1 output terminal of the frequency divider inhibits the pulse generator from producing an output signal.

5. A switching arrangement as defined in claim 4, wherein the output signals of the frequency divider are transmitted by way of differentiating circuits to the control circuit.

6. A switching arrangement as defined in claim 5, wherein the control circuit comprises a servo motor, which alternately actuates and deactuates the adjustable member whenever an output signal occurs at one of the output terminals of the frequency divider.

7. A switching arrangement as defined in claim 5, wherein the control circuit comprises a coil for control of the adjustable member, current flowing through the coil in one direction when an output signal occurs at the $n^{th}$ output terminal of the frequency divider and in the reverse direction with an output signal occurs at the n+1 output terminal of the frequency divider.

8. A switching arrangement as defined in claim 1 including a moisture sensing means which inhibits receipt of said enabling signal by said delay circuit means when a desired degree of moisture is present in the environment of said moisture sensing means, to prevent actuation of the adjustable member.

9. A switching arrangement as defined in claim 8, wherein the light sensitive switching means and the moisture sensing means are connected with the delay circuit means by means of an AND-gate.

10. A switching arrangement for control of a valve in an automatic sprinkling system comprising:
 a light sensitive switching means for delivering an enabling signal at dusk;
 a delay circuit means for receiving an enabling signal from the light sensitive switching means and delivering an actuating signal a predetermined delay period after receipt of the enabling signal;
 a control circuit for control of the valve, said control circuit receiving said actuating signal from the delay circuit means to open the valve; and
 a switching circuit, responsive to the actuating signal, for establishing an input signal to the delay circuit means which causes the delay circuit means to transmit a deactuating signal to the control circuit to close the valve a predetermined actuation period after receipt of the actuating signal by the control circuit.

11. A switching arrangement as defined in claim 10 wherein the predetermined delay period is shorter than the time period between dusk and dawn and longer than a maximum actuation period.

12. A switching arrangement as defined in claim 10 including a moisture sensing means disposed in the area swept by water from the automatic sprinkling system, which inhibits receipt of said enabling signal by said delay circuit means when a desired degree of moisture is present in the area swept by the sprinkling system, to prevent opening of the valve.

13. A switching arrangement as defined in clam 12, wherein the moisture sensing means is an evaporation cup disposed at or near ground level in the area swept by the sprinkling system and wherein the evaporating cup receives sprinkling or rain water and the moisture sensing means delivers an inhibit signal as long as the water has not yet evaporated from the cup.

* * * * *